US012707596B2

(12) United States Patent
Xiao et al.

(10) Patent No.: US 12,707,596 B2
(45) Date of Patent: Aug. 11, 2026

(54) INTEGRATED PREHEATED PUMP-DRIVEN TWO-PHASE FLOW SYSTEM

(71) Applicant: APALTEK CO., LTD., Shenzhen (CN)

(72) Inventors: Qineng Xiao, Dongguan (CN); Dagao Zheng, Shenzhen (CN); Jianfeng Li, Shenzhen (CN); Jingyun Huang, Shenzhen (CN); Jun-Chun Qiu, Shenzhen (CN)

(73) Assignee: APALTEK CO., LTD., Shenzhen (CN)

( * ) Notice: Subject to any disclaimer, the term of this patent is extended or adjusted under 35 U.S.C. 154(b) by 92 days.

(21) Appl. No.: 18/816,616

(22) Filed: Aug. 27, 2024

(65) Prior Publication Data

US 2025/0331131 A1 Oct. 23, 2025

(30) Foreign Application Priority Data

Apr. 18, 2024 (CN) ......................... 202410470641.7

(51) Int. Cl.
*H05K 7/20* (2006.01)

(52) U.S. Cl.
CPC ..... *H05K 7/20327* (2013.01); *H05K 7/20309* (2013.01); *H05K 7/20318* (2013.01)

(58) Field of Classification Search
CPC ....................... H05K 7/20309; H05K 7/20318
See application file for complete search history.

(56) References Cited

U.S. PATENT DOCUMENTS 7,729,118 B2 * 6/2010 Lai ........................ H10W 40/47 361/720
12,099,385 B2 * 9/2024 Tsai ......................... G06F 1/20
12,158,786 B2 * 12/2024 Tsai .......................... G06F 1/20
2006/0185829 A1 * 8/2006 Duan .................... H10W 40/47 257/E23.098
2006/0185830 A1 * 8/2006 Duan .................... H10W 40/47 257/E23.098

(Continued)

FOREIGN PATENT DOCUMENTS

WO WO-2025008050 A1 * 1/2025 ......... F04D 29/5806

OTHER PUBLICATIONS

WO-2025008050-A1 npl (Year: 2025).*

*Primary Examiner* — Gordon A Jones

(74) *Attorney, Agent, or Firm* — HDLS IPR SERVICES; Chun-Ming Shih

(57) ABSTRACT

A pump-driven two-phase flow system preheated in integration includes a condenser, a liquid storage tank, a circularly preheating chamber and an evaporation cooling plate, which are sequentially connected in a closed-loop. The condenser, the liquid storage tank and the circularly preheating chamber are integrated with each other. The circularly preheating chamber includes a preheating chamber and a circulating pump. The preheating chamber includes a liquid entry room and a preheating room, which are isolated from each other. The circulating pump includes a pump inlet, a pump and a pump outlet. The pump inlet is located in the liquid entry room and connected to the liquid storage tank. The pump and the pump outlet are disposed in the preheating room. The evaporation cooling plate communicates with the preheating room. A liquid refrigerant flows into the preheating room through the pump outlet and touches the pump to exchange heat.

22 Claims, 6 Drawing Sheets

(56) References Cited

U.S. PATENT DOCUMENTS

| | | | | |
|---|---|---|---|---|
| 2012/0312504 | A1* | 12/2012 | Suzuki | H05K 1/0201 62/190 |
| 2016/0363967 | A1* | 12/2016 | Tsai | H05K 7/20272 |
| 2019/0121406 | A1* | 4/2019 | Tsai | G06F 1/20 |
| 2020/0037463 | A1* | 1/2020 | Hashiba | H05K 7/20 |
| 2020/0309136 | A1* | 10/2020 | Helmis | F04D 13/0606 |
| 2025/0003652 | A1* | 1/2025 | Chan | A47J 27/04 |
| 2025/0294709 | A1* | 9/2025 | Yang | H05K 7/20327 |
| 2026/0059710 | A1* | 2/2026 | Xiao | G06F 1/20 |
| 2026/0082508 | A1* | 3/2026 | Hsu | G06F 1/20 |

* cited by examiner

INTEGRATED PREHEATED PUMP-DRIVEN TWO-PHASE FLOW SYSTEM

BACKGROUND

Technical Field

The disclosure relates to a technical field of a cooling system, particularly to a pump-driven two-phase flow system preheated in integration.

Related Art

With the iterative updates of electronic technology and packaging process technology, the functions of electronic device chips are becoming increasingly perfect, and chips and electronic equipment are gradually developing in the direction of integration and miniaturization. The performance and integration of various types of electronic equipment continue to improve, and hundreds of millions of electronic components are packaged on a very small substrate, which makes it increasingly difficult to dissipate heat and control temperature of equipment in limited space.

In order to meet the heat dissipation needs of these places, related-art research directions have been developed from traditional air cooling and single-phase liquid convection cooling to two-phase boiling heat transfer with higher heat dissipation potential. Phase-change-based flow boiling heat transfer (microchannel), two-phase spray cooling, and two-phase jet cooling are several commonly used heat dissipation methods. However, spray cooling and jet cooling systems are more complex and occupy a larger space, and are not suitable for use in a narrow space. With the development of micro-machining technology, micro-channel cooling methods with compact structure, light weight and good temperature uniformity have broad application prospects in the field of high heat flux density cooling in the future. However, air contains moisture. When a related-art pump-driven two-phase flow (hereinafter referred to as pump-driven two-phase flow) system is pumping the liquid refrigerant to a remote evaporator attached onto a heat source, it must use a transmission pipe for transmission. The liquid refrigerant with too low temperature will inevitably condense into water droplets during the transmission process because the outer wall of the transmission pipe comes into contact with the moisture in the air. Once the water droplets fall on the electronic components of the circuit board, it will cause a short circuit and damage. Accordingly, related-art pump-driven two-phase flow systems usually have a regenerator in front of the evaporator to heat the refrigerant entering the evaporator, and the regenerator will occupy a certain amount of volume of the entire pump-driven two-phase flow system.

As a result, how to omit the regenerator in front of the evaporator in a pump-driven two-phase flow system and guarantee effective evaporation of the refrigerant becomes a technical issue to be solved.

SUMMARY

Because of the drawbacks of the related art, an object of the disclosure is to provide a pump-driven two-phase flow system preheated in integration, which can solve the problem of the related-art pump-driven two-phase flow system needing a regenerator in front of the evaporator to guarantee the effective evaporation of the refrigerant.

To accomplish the above object, the disclosure provides a pump-driven two-phase flow system preheated in integration, used with a liquid refrigerant, which includes a condenser, a liquid storage tank, a circularly preheating chamber and an evaporation cooling plate, which are sequentially connected in a closed-loop. The condenser, the liquid storage tank and the circularly preheating chamber are integrated with each other. The circularly preheating chamber includes a preheating chamber and a circulating pump. The preheating chamber includes a liquid entry room and a preheating room, which are isolated from each other. The circulating pump includes a pump inlet, a pump and a pump outlet. The pump inlet is located in the liquid entry room and connected to the liquid storage tank. The pump and the pump outlet are disposed in the preheating room. The evaporation cooling plate communicates with the preheating room. The liquid refrigerant flows into the preheating room through the pump outlet and touches the pump to exchange heat.

Furthermore, the preheating room includes a chamber; and a baffle, disposed in the chamber to divide an inner chamber of the chamber into the liquid entry room and the preheating room.

Furthermore, the preheating room is further disposed with a heating member used to heat up the liquid refrigerant.

Furthermore, the heating member is embedded into a room wall of the preheating room.

Furthermore, the pump includes a pump body; a pump casing, disposed to cover the pump and seal the pump body therein; and multiple cooling fins, evenly formed on an outer surface of the pump casing.

Furthermore, the circularly preheating chamber is defined with a height direction, the multiple cooling fins divide the preheating room into a bottom flow channel, multiple middle flow channels and a top flow channel along the height direction, the pump outlet is connected to the bottom flow channel, and the top flow channel is connected to the evaporation cooling plate.

Furthermore, the chamber includes a bottom plate, a top plate, a first side plate, a second side plate and a third side plate, the bottom plate and the top plate are disposed oppositely, the first side plate, the second side plate and the third side plate are connected between the top plate and the bottom plate in a C shape, the pump is disposed on the bottom plate, the baffle and the second side plate are separately connected to two ends of the first side plate, the bottom plate, the third side plate and the top plate, the cooling fins comprise a bottom fin, a top fin, multiple first middle fins and multiple second middle fins, the bottom fin is separately connected to the first side plate, the baffle and the third side plate to associate with the bottom plate and the second side plate to constitute the bottom flow channel, the multiple first middle fins and the multiple second middle fins are interlacedly disposed at intervals from bottom to top, the multiple first middle fins are separately connected to the first side plate, the second side plate and the third side plate to associate with the bottom plate and the baffle to constitute the multiple middle flow channels, and the multiple second middle fins are separately connected to the first side plate, the baffle and the third side plate to associate with the bottom plate and the second side plate to constitute the multiple middle flow channels.

Furthermore, the multiple cooling fins further comprise multiple auxiliary fins located on the bottom flow channel and the top flow channel.

Furthermore, a tank of the liquid storage tank is configured into a thermally isolated tank, the condenser comprises a condenser body and multiple cooling fans, and the condenser body is connected between the evaporation cooling plate and the liquid storage tank.

Furthermore, the pump casing is formed with a set of symmetric rib sheets to divide the preheating chamber into an upper layer and a lower layer, the upper layer communicates with the evaporation cooling plate, a space is kept between a rear side of the rib sheet and the chamber, other sides of the rib sheet are connected to the chamber, and the upper layer communicates with the lower layer through the space.

Furthermore, front sides and rear sides of the cooling fins keep an interval with the chamber, the cooling fin extends from one end toward the other end, and an extended distal end is connected to the chamber.

Furthermore, the pump-driven two-phase flow system preheated in integration further includes a temperature sensor disposed at an inlet of the evaporation cooling plate.

In comparison with the related art, the disclosure has the following functions. The disclosure provides a pump-driven two-phase flow system preheated in integration. The integrated disposition of the condenser, the liquid storage tank and the circularly preheating chamber can effectively reduce the volume to meet the using requirement in a narrow space. By way of the circularly preheating chamber, the circularly preheating chamber configured into the preheating chamber and the circulating pump and the preheating chamber configured into the liquid storage tank and the preheating room, the refrigerant can be transmitted to the preheating room through the circulating pump and then absorb the heat of the pump in the preheating room to increase the temperature of the refrigerant to prevent the refrigerant from condensing with water droplets during the transmission process before entering the evaporation cooling plate.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

In the description of the disclosure, it is noted that the terms indicating directions or positional relationship such as "central", "longitudinal", "transverse", "upper", "lower", "front", "rear", "left", "right", "perpendicular", "horizontal", top", "bottom", "inner and "outer", are based upon the directions or positional relationship shown in the figures. They are used to depict the disclosure and simplify the description but not to express or imply that the indicated devices or elements must have a specific direction or be constructed or operated in a specific direction. Thus, they should not be construed as limitations of the disclosure. In addition, the terms used in the description, such as "first" and "second", are used for depiction, but cannot be understood to be a relative expression or hint or imply the amount of a technical feature indicated. Those technical features limited by "first" or "second" may express or imply that one or more features are included. In the description of the disclosure, unless expressively indicated, the term "multiple" means two or more.

In the description of the disclosure, it should be noted that, unless otherwise clearly stated and limited, the terms "installation" and "connection" should be understood in a broad sense. For example, it can be a fixed connection, a detachable connection or an integral connection; it can be a mechanical connection or an electrical connection; it can be a direct connection or an indirect connection through an intermediate medium; and it can be an internal communication between two components. For those of ordinary skill in the art, the specific meanings of the above terms in this disclosure can be understood on a case-by-case basis.

In related art, phase-change-based flow boiling heat transfer (microchannel), two-phase spray cooling, and two-phase jet cooling are several commonly used heat dissipation methods. However, spray cooling and jet cooling systems are more complex and occupy a larger space, and are not suitable for use in a narrow space. Also, the developing direction of the related-art micro-machining technology is the microchannel cooling method with compact structure, light weight and good temperature uniformity. However, related-art pump-driven two-phase flow systems usually have a regenerator in front of the evaporator to heat the refrigerant entering the evaporator, and the regenerator will occupy a certain amount of volume of the entire pump-driven two-phase flow system.

Figure 1:
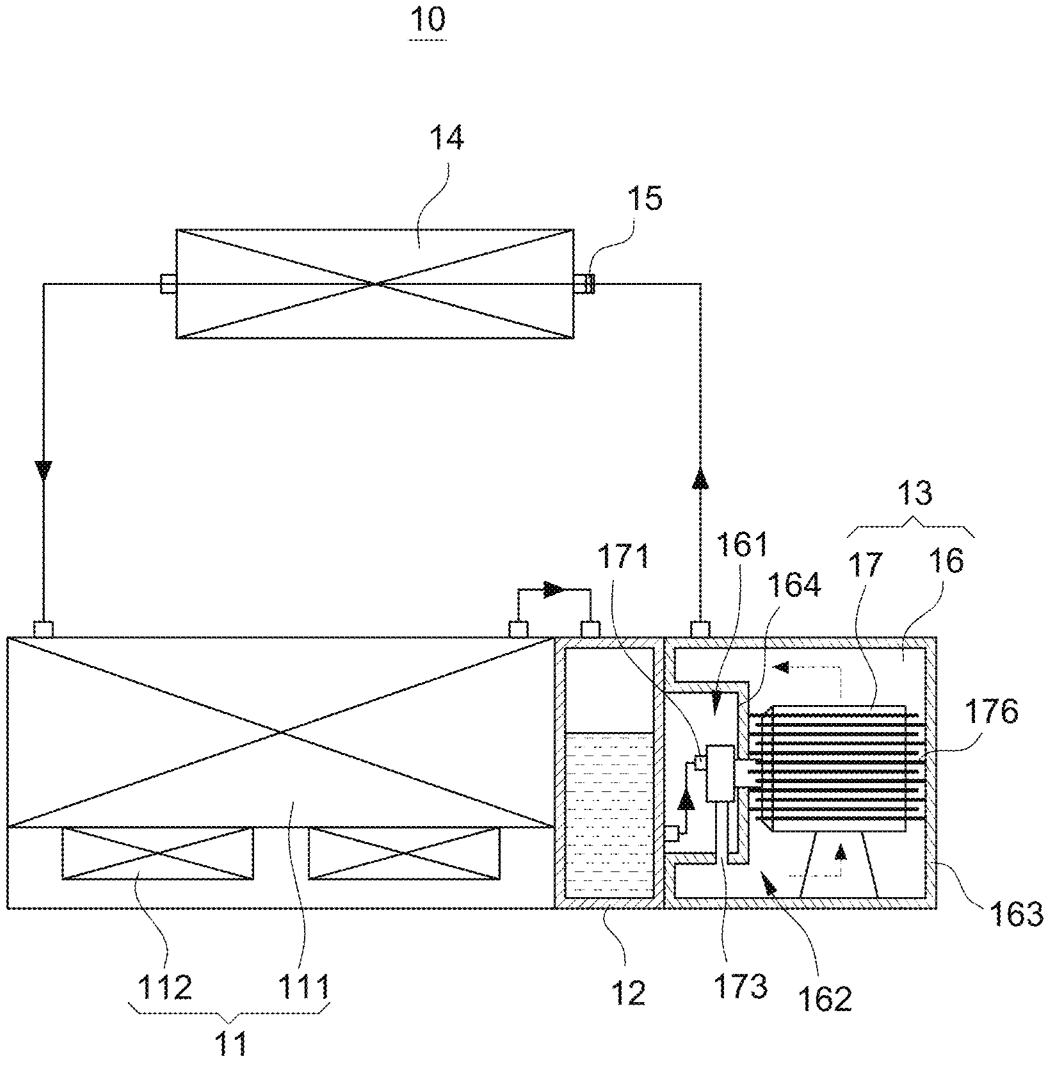
FIG. 1 is a schematic plan view of the first embodiment of the pump-driven two-phase flow system preheated in integration of the disclosure.
Figure 2:
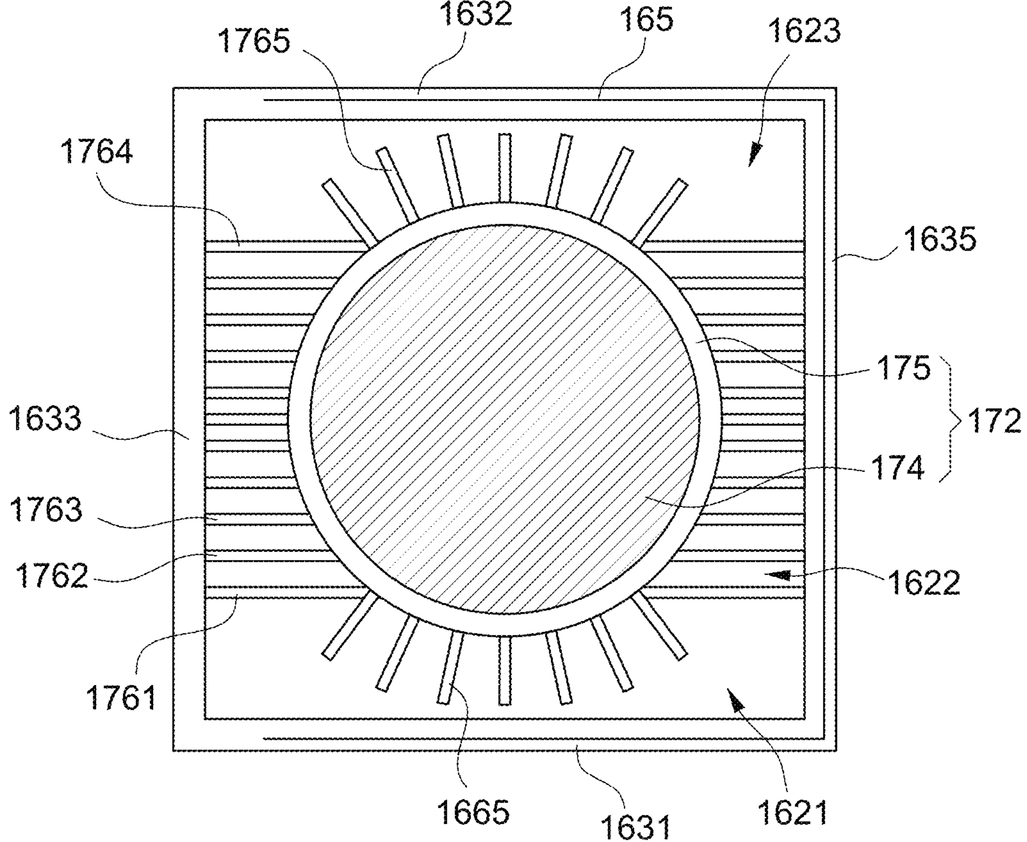
FIG. 2 is a schematic cross-sectional view of the circularly preheating chamber of the first embodiment of the pump-driven two-phase flow system preheated in integration of the disclosure in a direction (the chamber and the cooling fins are unhatched)
Figure 3:
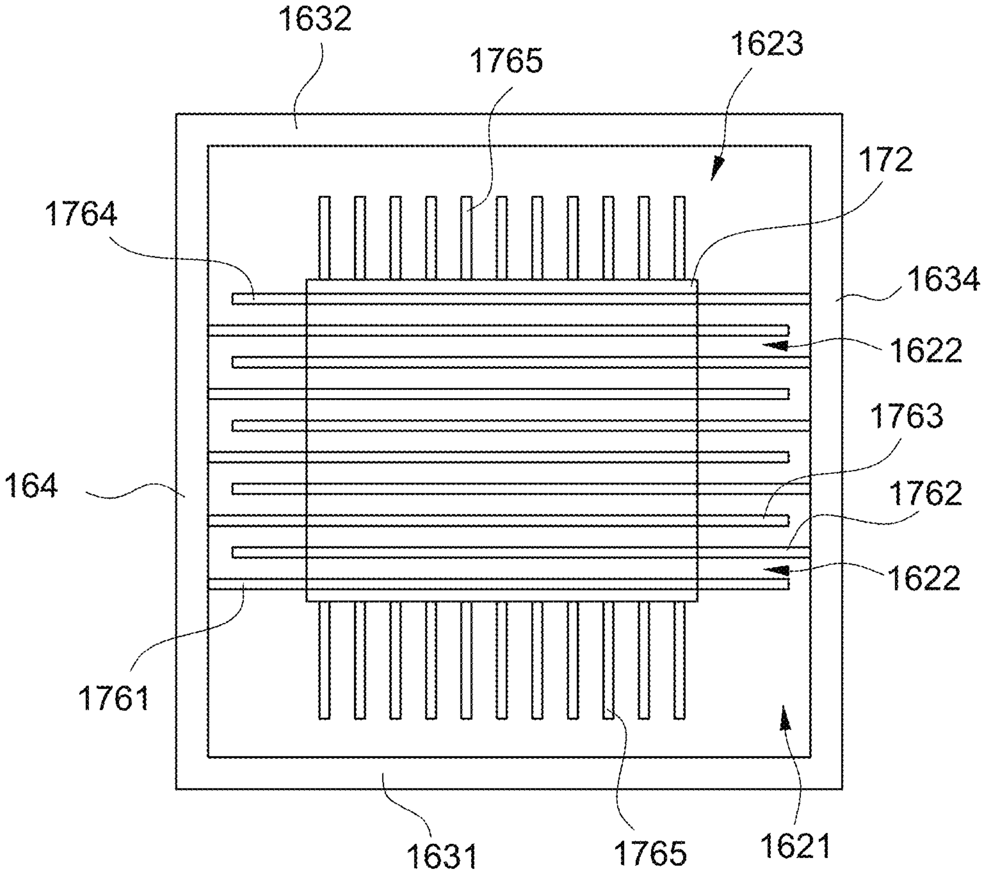
FIG. 3 is a schematic cross-sectional view of the circularly preheating chamber of the first embodiment of the pump-driven two-phase flow system preheated in integration of the disclosure in another direction (the chamber is unhatched)

Please refer to FIGS. 1-3. The first embodiment of the disclosure provides a pump-driven two-phase flow system preheated in integration 10, which includes a condenser 11, a liquid storage tank 12, a circularly preheating chamber 13 and an evaporation cooling plate 14. That is, the condenser 11, the liquid storage tank 12, the circularly preheating chamber 13 and the evaporation cooling plate 14 constitute a closed circular loop of a refrigerant. The refrigerant is driven by the circularly preheating chamber 13 to enter the evaporation cooling plate 14 to evaporate and absorb the heat of the heat source on the evaporation cooling plate 14 and then enter the condenser 11 to be condensed and liquidized. The liquidized liquid refrigerant enters the liquid storage tank 12 and then circulates back to the circularly preheating chamber 13. Accordingly, when the pump-driven two-phase flow system preheated in integration 10 is cooling a target device, only the evaporation cooling plate 14 is needed to be disposed on the heat source, the condenser 11, the liquid storage tank 12 and the circularly preheating chamber 13 may be disposed away from the heat source to allow the condenser 11, the liquid storage tank 12 and the circularly preheating chamber 13 to be integratedly disposed. The integrated disposition may arrange the condenser 11, the liquid storage tank 12 and the circularly preheating chamber 13 to be disposed in a case (not shown) with disposing the evaporation cooling plate 14 on a heat source as shown in FIG. 1, so as to effectively reduce the volume of the pump-driven two-phase flow system preheated in integration 10 to make the pump-driven two-phase flow system preheated in integration 10 meet the using requirement in a narrow space. The circularly preheating chamber 13 includes a preheating chamber 16 and a circulating pump 17. The circulating pump 17 is located in the preheating chamber 16. The preheating chamber 16 has a liquid entry room 161 and a preheating room 162, which are isolated from each other. The circulating pump 17 has a pump inlet 171, a pump 172 and a pump outlet 173. The pump inlet 171 is located in the liquid entry room 161 and connected to the liquid storage tank 12. The pump 172 and the pump outlet 173 are disposed in the preheating room 162. The evaporation cooling plate 14 communicates with the preheating room 162. The pump outlet 173 communicates with the preheating room 162. As a result, under the action of the pump 172, the liquid refrigerant enters the preheating room 162 from the outlet (unlabeled) of the liquid storage tank 12 through the pump inlet 171 and the pump outlet 173 to perform heat exchange to absorb the heat from the working pump 172. The liquid refrigerant with absorbing heat flows into the evaporation cooling plate 14 through transmission of a transmission pipe (unlabeled) to guarantee that the liquid refrigerant will not condense on the outer wall of the transmission pipe to generate water droplets because of the moisture in the air during the transmission process. Because the liquid refrigerant in the pipe has been preheated, the liquid refrigerant will not be cool enough to condense with water droplets on the pipe wall of the transmission pipe. As a result, no water droplet will fall down on the electronic components to guarantee both the omission of a regenerator and the cooling effect of the pump-driven two-phase flow system preheated in integration 10. Meanwhile, it is noted that the refrigerant absorbing the heat of the pump 172 may further omit cooling parts of the pump 172. This can reduce energy consumption, reduce the volume of the circulating pump 17 and effectively reduce working noise and vibration to improve comfortability.

In some embodiments, the preheating chamber 16 further includes a chamber 163 and a baffle 164. The chamber 163 has an inner chamber. The inner chamber is the liquid entry room 161 and the preheating room 162. The baffle 164 is disposed in the chamber 163 to divide the inner chamber of the chamber 163 into the liquid entry room 161 and the preheating room 162. The circulating pump 17 is disposed in the chamber 163 and part of the circulating pump 17 passes through the baffle 164 to make the pump inlet 171 located in the liquid entry room 1611 on a side of the baffle 164. The pump outlet 173 is connected to the preheating room 162 after passing through the baffle 164 to make the pump 172 and the pump outlet 173 located in the preheating room 162 to allow the liquid refrigerant to absorb the heat of the pump 172. This can prevent the liquid refrigerant from being too cool after entering the evaporation cooling plate 14 and omit cooling parts of the pump 172, so that energy consumption can be reduced, the volume of the circulating pump 17 can be further reduced, and the working noise and vibration can be effectively reduced to improve comfortability.

In some embodiments, the preheating room 162 is further disposed with a heating member 165 (shown in FIG. 2). The heating member 165 is used to additionally heat up the liquid refrigerant. It is noted that when the heat generated from the working circulating pump 17 to be recycled is still insufficient, the heating member 165 may be used to additionally heat up the liquid refrigerant to guarantee that the liquid refrigerant will not condense on the outer wall of the transmission pipe to generate water droplets because of the moisture in the air during the transmission process. Furthermore, the heating member 165 is embedded into the room wall (unlabeled) of the preheating room 162 to enhance safety of the circularly preheating chamber 13, prevent the heating member 165 and the circulating pump 17 from short-circuiting, and prevent the heating member 165 from directly touching the circulating pump 17 to heat and damage the circulating pump 17.

In some embodiments, the pump 172 includes a pump body 174, a pump casing 175 and multiple cooling fins 176. The pump casing 175 is disposed to cover the pump body 174 and seal the pump body 174 therein. The pump body 174 works after being electrified to convert electric energy into power driving the refrigerant to flow. The pump body 174 generates heat when working. The pump casing 175 outside the pump body 174 can effectively protect the pump body 174 to prevent the liquid refrigerant from corroding the pump body 174 and can rapidly conduct the heat generated from the pump body 174 to the liquid refrigerant. The cooling fins 176 are evenly formed on the outer surface of the pump casing 175, so that the cooling fins 176 disposed on the pump casing 175 may effectively increase the heat exchange area of the circulating pump 17 and the refrigerant and divide the preheating room 162 into multiple flow channels connected to each other to further increase the heat absorption time of the refrigerant to guarantee the preheating effect of the circularly preheating chamber 13 to the refrigerant.

In some embodiments, as shown in FIG. 2, the multiple cooling fins 176 divide the preheating room 162 into a bottom flow channel 1621, multiple middle flow channels 1622 and a top flow channel 1623 along the height direction. The pump outlet 173 is connected to the bottom flow channel 1621 and the top flow channel 1623 is connected to the evaporation cooling plate 14 so that the refrigerant enters the bottom flow channel 1621 of the preheating room 162 first, then passes the multiple middle flow channels 1622 and finally arrives at the top flow channel 1623 and flows out. This stays the time of the refrigerant entering the evaporation cooling plate 14 under the guiding of the pipeline to effectively increase the staying time of the refrigerant in the preheating room 162 to guarantee the preheating effect to the refrigerant.

In some embodiments, as shown in FIG. 3 in association with FIG. 2, the chamber 163 includes a bottom plate 1631, a top plate 1632, a first side plate 1633, a second side plate 1634 and a third side plate 1635. The bottom plate 1631 and the top plate 1632 are disposed oppositely. The first side plate 1633, the second side plate 1634 and the third side plate 1635 are connected in order in a C shape. The first side plate 1633, the second side plate 1634 and the third side plate 1635 are connected between the bottom plate 1631 and the top plate 1632. The pump 172 is disposed on the bottom plate 1631. The baffle 164 and the second side plate 1634 are separately connected to two ends of the first side plate 1633, the bottom plate 1631, the third side plate 1635 and the top plate 1632. The multiple cooling fins 176 include a bottom fin 1761, a top fin 1764, multiple first middle fins 1762 and multiple second middle fins 1763. The bottom fin 1761 is separately connected to the first side plate 1633, the baffle 164 and the third side plate 1635 to associate with the bottom plate 1631 and the second side plate 1634 to constitute the bottom flow channel 1621. The multiple first middle fins 1762 and the multiple second middle fins 1763 are interlacedly disposed at intervals from the bottom to the top. The multiple first middle fins 1762 are separately connected to the first side plate 1633, the second side plate 1634 and the third side plate 1635 to associate with the bottom plate 1631 and the baffle 164 to constitute the multiple middle flow channels 1622. The multiple second middle fins 1763 are separately connected to the first side plate 1633, the baffle 164 and the third side plate 1635 to associate with the bottom plate 1631 and the second side plate 1634 to constitute the multiple middle flow channels 1622. As a result, the heat exchange area of the circulating pump 17 and the refrigerant entering the preheating room 162 can be effectively increased and the flowing direction of the refrigerant can be effectively guided to increase the staying heat exchange time of the refrigerant in the preheating room 162.

In some embodiments, as shown in FIGS. 2 and 3, the multiple cooling fins 176 further include multiple auxiliary fins 1765 located in the bottom flow channel 1621 and the top flow channel 1623 to further increase the heat exchange area of the refrigerant and the circulating pump 17 to further improve the preheating effect of the preheating room 162 to the refrigerant to prevent the refrigerant from condensing with water droplets during the transmission process before entering the evaporation cooling plate 14.

In some embodiments, the tank of the liquid storage tank 12 is configured into a thermally isolated tank, so that the liquid storage tank 12 is located between the condenser 11 and the circularly preheating chamber 13, by the tank of the liquid storage tank 12 configured into a thermally isolated tank, directly ineffective heat exchange between the condenser 11, the liquid storage tank 12 and the circularly preheating chamber 13 can be avoided after the condenser 11, the liquid storage tank 12 and the circularly preheating chamber 13 have been integrated with each other. Not only is the volume of the pump-driven two-phase flow system preheated in integration 10 reduced, but the heat absorption and cooling ability of the pump-driven two-phase flow system preheated in integration 10 can be guaranteed.

In some embodiments, the condenser 11 includes a condenser body 111 and multiple cooling fans 112. After the refrigerant has been evaporated in the evaporation cooling plate 14, the condenser body 111 is cooled by blowing of the multiple cooling fans 112 to condense to be a liquid refrigerant. The condenser body 111 is connected between the evaporation cooling plate 14 and the liquid storage tank 12. The refrigerant is driven by the circulating pump 17 to pass the condenser body 111, the liquid storage tank 12, the circulating pump 17, the preheating room 162 and the evaporation cooling plate 14 in order and then circulate into the condenser body 111 to start next cycle. The cooling fans 112 may be configured into multiple. Different amounts of the cooling fans 112 are opened according to different cooling requirements.

In some embodiments, the pump-driven two-phase flow system preheated in integration 10 further includes a temperature sensor 15 disposed at the inlet of the evaporation cooling plate 14 to monitor the instant temperature of the refrigerant entering the evaporation cooling plate 14 and control the operating power of the heating member 165 to guarantee that the liquid refrigerant will not condense on the outer wall of the transmission pipe to generate water droplets because of the moisture in the air during the transmission process.

Some embodiments provide a pump-driven two-phase flow system preheated in integration 10 and apply the pump-driven two-phase flow system preheated in integration 10 in a cooling scenario with a narrow space. The pump-driven two-phase flow system preheated in integration 10 includes a condenser 11, a liquid storage tank 12, a circularly preheating chamber 13, an evaporation cooling plate 14 and a temperature sensor 15. The condenser 11, the liquid storage tank 12, the circularly preheating chamber 13 and the evaporation cooling plate 14 constitute a closed circular loop of refrigerant. The temperature sensor 15 is disposed at the inlet of the evaporation cooling plate 14 to detect the temperature of the refrigerant entering the evaporation cooling plate 14 from the circularly preheating chamber 13. The circularly preheating chamber 13 includes a preheating chamber 16 and a circulating pump 17. The preheating chamber 16 includes a liquid entry room 161, a preheating room 162, a chamber 163, a baffle 164 and a heating member 165. The circulating pump 17 has a pump inlet 171, a pump 172 and a pump outlet 173. The pump 172 includes a pump body 174, a pump casing 175 and multiple cooling fins 176. The pump casing 175 is disposed to cover the pump body 174 and seal the pump body 174 therein. The cooling fins 176 are evenly formed on the outer surface of the pump casing 175. The multiple cooling fins 176 include a bottom fin 1761, a top fin 1764, multiple first middle fins 1762, multiple second middle fins 1763 and multiple auxiliary fins 1765. The bottom fin 1761 is separately connected to the first side plate 1633, the baffle 164 and the third side plate 1635 to associate with the bottom plate 1631 and the second side plate 1634 to constitute the bottom flow channel 1621. The multiple first middle fins 1762 and the multiple second middle fins 1763 are interlacedly disposed at intervals from the bottom to the top. The multiple first middle fins 1762 are separately connected to the first side plate 1633, the second side plate 1634 and the third side plate 1635 to associate with the bottom plate 1631 and the baffle 164 to constitute the multiple middle flow channels 1622. The multiple second middle fins 1763 are separately connected to the first side plate 1633, the baffle 164 and the third side plate 1635 to associate with the bottom plate 1631 and the second side plate 1634 to constitute the multiple middle flow channels 1622. The multiple auxiliary fins 1765 are located in the bottom flow channel 1621 and the top flow channel 1623. The tank of the liquid storage tank 12 is configured into a thermally isolated tank. The condenser 11 includes a condenser body 111 and multiple cooling fans 112. The condenser body 111 is connected between the evaporation cooling plate 14 and the liquid storage tank 12. The multiple cooling fans 112 are used for cooling the condenser body 111. When assembling, the evaporation cooling plate 14 is disposed on the heat source, the condenser 11, the liquid storage tank 12 and the circularly preheating chamber 13 may be disposed away from the heat source. Meanwhile, by way of preheating of the circulating pump 17 and the heating member 165 to the refrigerant, no water droplet will be generated in the transmission process of the liquid refrigerant and the circulating pump 17 can be cooled, so as to omit of a cooling structure of the circulating pump 17. This can reduce energy consumption and noise of the system and reduce the volume of the pump-driven two-phase flow system preheated in integration 10.

In sum, the disclosure provides a pump-driven two-phase flow system preheated in integration 10, which includes a condenser 11, a liquid storage tank 12, a circularly preheating chamber 13, and an evaporation cooling plate 14. The condenser 11, the liquid storage tank 12, the circularly preheating chamber 13 and the evaporation cooling plate 14 constitute a closed circular loop of refrigerant. The condenser 11, the liquid storage tank 12 and the circularly preheating chamber 13 are integrated with each other. The circularly preheating chamber 13 includes a preheating chamber 16 and a circulating pump 17. The preheating chamber 16 includes a liquid entry room 161 and a preheating room 162, which are isolated from each other. The circulating pump 17 has a pump inlet 171, a pump 172 and a pump outlet 173. The pump inlet 171 is located in the liquid entry room 161 and connected to the liquid storage tank 12. The pump 172 and the pump outlet 173 are disposed in the preheating room 162. The evaporation cooling plate 14 communicates with the preheating room 162. The liquid refrigerant flows into the preheating room 162 through the pump outlet 173 and touches the pump 172 to exchange heat. The integrated disposition of the condenser 11, the liquid storage tank 12 and the circularly preheating chamber 13 can effectively reduce the volume to meet the using requirement in a narrow space. By way of the circularly preheating chamber 13, the circularly preheating chamber 13 configured into the preheating chamber 16 and the circulating pump 17 and the preheating chamber 16 configured into the liquid storage tank 161 and the preheating room 162, the refrigerant can be transmitted to the preheating room 162 through the circulating pump 17 and then absorb the heat of the pump 172 in the preheating room 162 to increase the temperature of the refrigerant to prevent the refrigerant from condensing with water droplets during the transmission process before entering the evaporation cooling plate 14.

In addition, by the circulating pump 17 wrapped by the liquid refrigerant, the liquid refrigerant can absorb part of the noise to further improve the effect of noise reduction.

Figure 4:
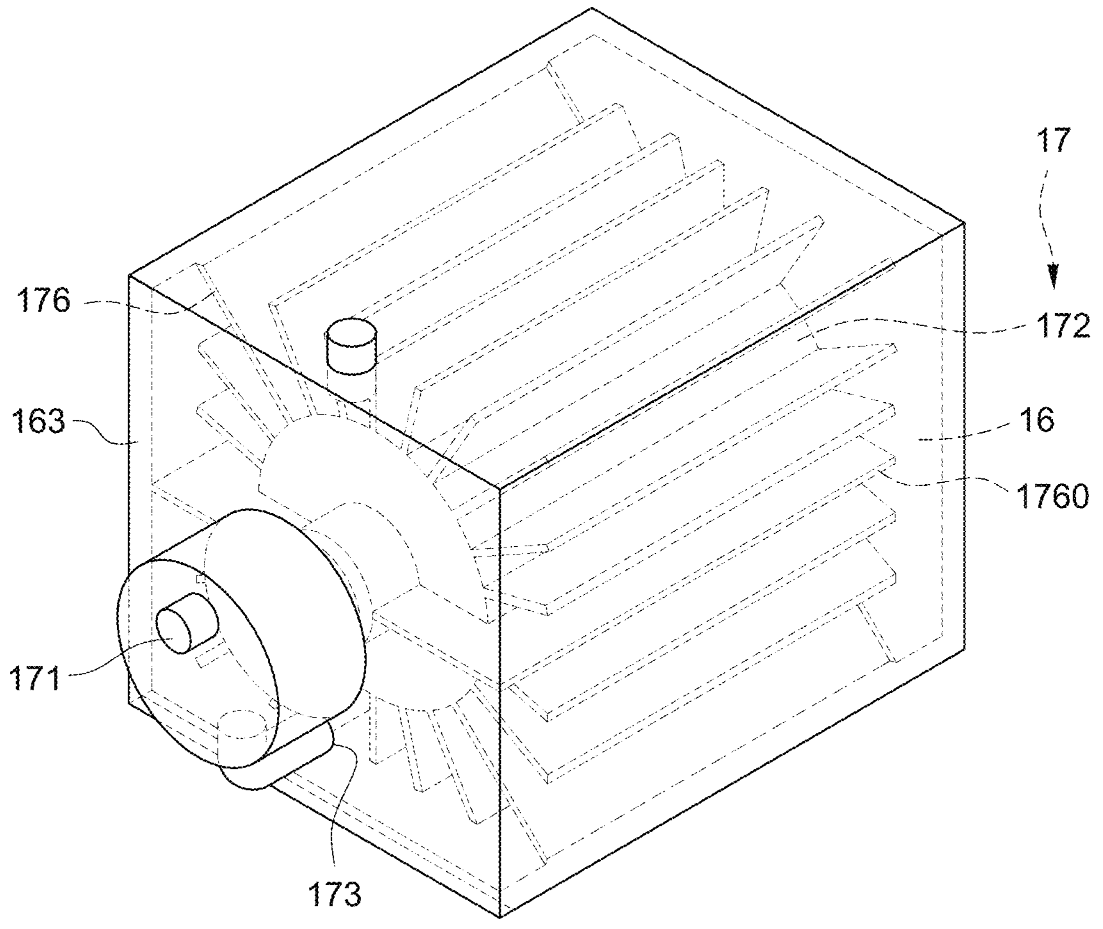
FIG. 4 is a schematic perspective view of the circularly preheating chamber of the second embodiment of the pump-driven two-phase flow system preheated in integration of the disclosure.
Figure 5:
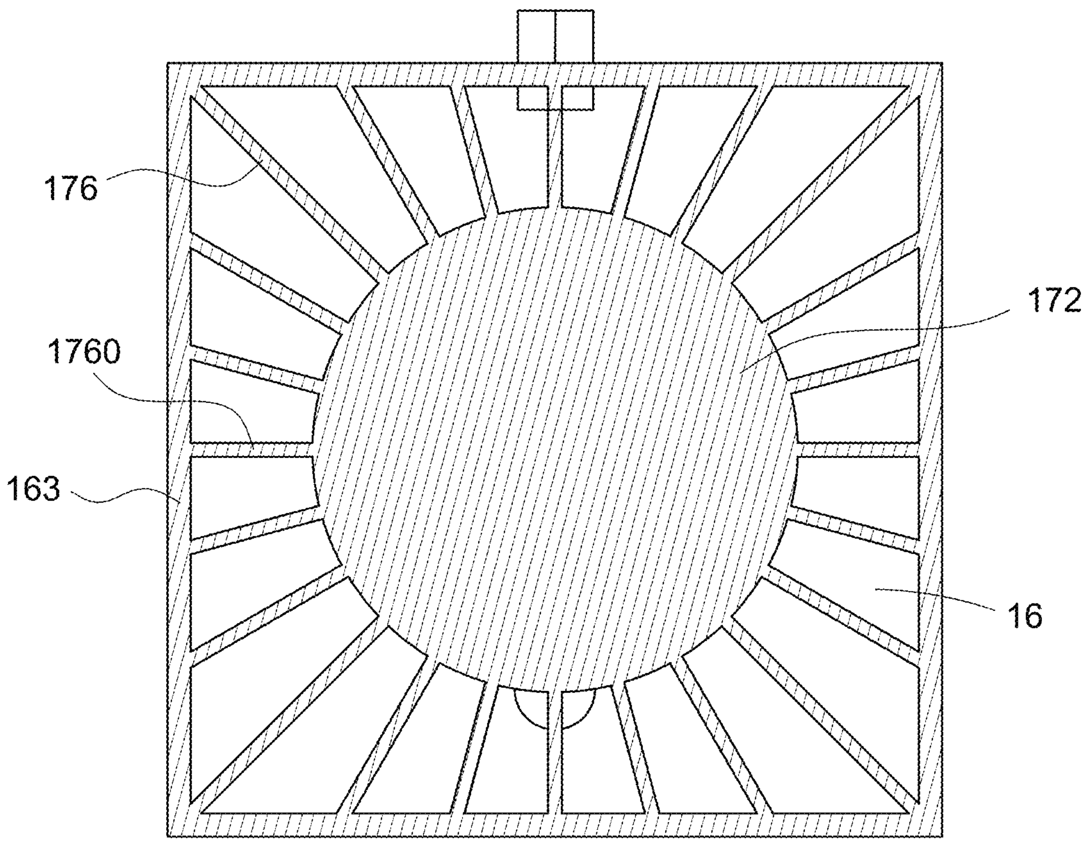
FIG. 5 is a schematic cross-sectional view of the circularly preheating chamber of the second embodiment of the pump-driven two-phase flow system preheated in integration of the disclosure in a direction.
Figure 6:
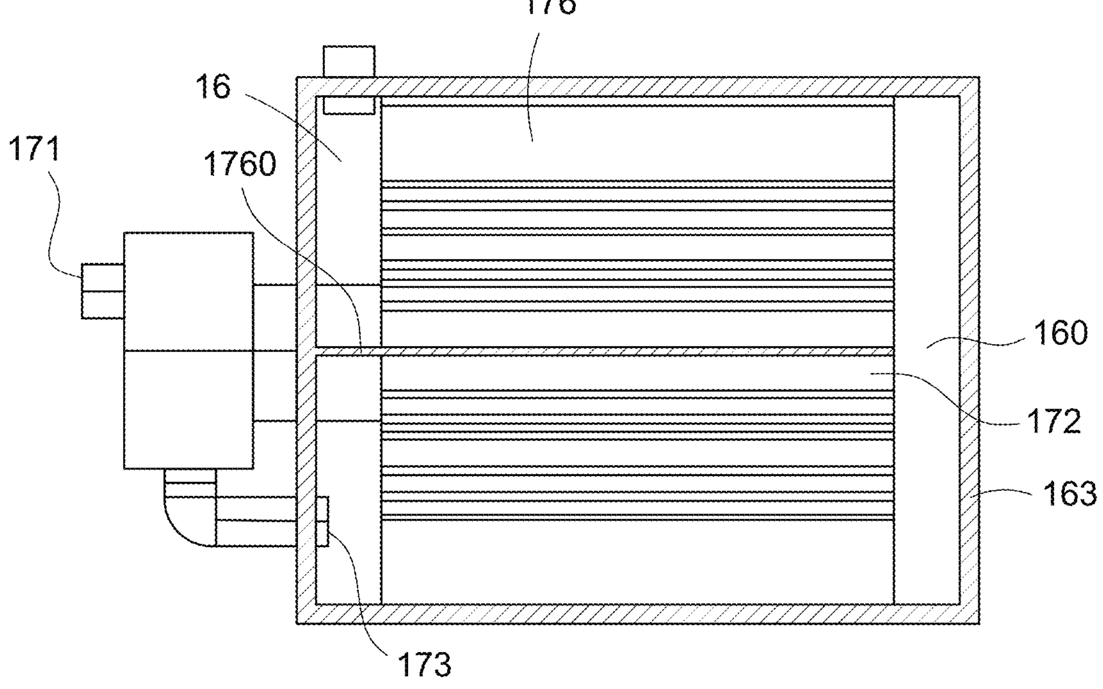
FIG. 6 is a schematic cross-sectional view of the circularly preheating chamber of the second embodiment of the pump-driven two-phase flow system preheated in integration of the disclosure in another direction (part of the cooling fins are unhatched).

Please refer to FIGS. 4-6. The second embodiment of the disclosure also provides a pump-driven two-phase flow system preheated in integration 10. The second embodiment is substantially the same as the first embodiment, and the difference is only at the circularly preheating chamber 13.

The outer periphery of the pump 172 of the circulating pump 17 is protruded with a set of symmetric rib sheets 1760 to divide the preheating chamber 16 into two layers. The lower layer (unlabeled) is used for being entered by the refrigerant and absorbing heat (the pump outlet 173 is located in the lower layer). The upper layer (unlabeled) is used for allowing the refrigerant to absorb heat and be output after absorbing heat (the upper layer communicates with the evaporation cooling plate 14). As shown in FIG. 6, a space 160 is kept between the rear side of the rib sheet 1760 in the preheating chamber 16 and the inner wall of the chamber 163 to make the preheating chamber 16 appear to be a C shape and make the upper layer communicate with the lower layer through the space 160. The front sides and the rear sides of all of the cooling fins 176 keep an interval with the inner wall of the chamber 163. Each cooling fin 176 extends from one end (such as the pump casing 175) toward the other end, and the extended distal end is connected to the inner wall of the chamber 163.

The circulating pump 17 is disposed in the preheating chamber 16. After the refrigerant passes the circulating pump 17 along the C-shaped preheating chamber 16, it will absorb the heat conducted from the circulating pump 17 to the cooling fins 176 to heat up the refrigerant to reach the required temperature of entering the evaporation cooling plate 14 so as to prevent the refrigerant from condensing with water droplets during the transmission process before entering the evaporation cooling plate 14.

While this disclosure has been described by means of specific embodiments, numerous modifications and variations could be made thereto by those skilled in the art without departing from the scope and spirit of this disclosure set forth in the claims.

What is claimed is:

1. A pump-driven two-phase flow system preheated in integration, used with a liquid refrigerant, comprising a condenser, a liquid storage tank, a circularly preheating chamber and an evaporation cooling plate, which are sequentially connected in a closed-loop, wherein the condenser, the liquid storage tank and the circularly preheating chamber are integrated with each other, the circularly preheating chamber comprises a preheating chamber and a circulating pump, the preheating chamber comprising a liquid entry room and a preheating room, which are isolated from each other, the circulating pump comprises a pump inlet, a pump and a pump outlet, the pump inlet is located in the liquid entry room and connected to the liquid storage tank, the pump and the pump outlet are disposed in the preheating room, the evaporation cooling plate communicates with the preheating room, and the liquid refrigerant flows into the preheating room through the pump outlet and touches the pump to exchange heat.

2. The pump-driven two-phase flow system preheated in integration of claim 1, wherein the preheating room comprises:

a chamber; and a baffle, disposed in the chamber to divide an inner chamber of the chamber into the liquid entry room and the preheating room.

3. The pump-driven two-phase flow system preheated in integration of claim 2, wherein the preheating room is further disposed with a heating member used to heat up the liquid refrigerant.

4. The pump-driven two-phase flow system preheated in integration of claim 3, wherein the heating member is embedded into a room wall of the preheating room.

5. The pump-driven two-phase flow system preheated in integration of claim 2, wherein the pump comprises:

a pump body;

a pump casing, disposed to cover the pump and seal the pump body therein; and multiple cooling fins, evenly formed on an outer surface of the pump casing.

6. The pump-driven two-phase flow system preheated in integration of claim 5, wherein the circularly preheating chamber is defined with a height direction, the multiple cooling fins divide the preheating room into a bottom flow channel, multiple middle flow channels and a top flow channel along the height direction, the pump outlet is connected to the bottom flow channel, and the top flow channel is connected to the evaporation cooling plate.

7. The pump-driven two-phase flow system preheated in integration of claim 6, wherein the chamber comprises a bottom plate, a top plate, a first side plate, a second side plate and a third side plate, the bottom plate and the top plate are disposed oppositely, the first side plate, the second side plate and the third side plate are connected between the top plate and the bottom plate in a C shape, the pump is disposed on the bottom plate, the baffle and the second side plate are separately connected to two ends of the first side plate, the bottom plate, the third side plate and the top plate, the cooling fins comprise a bottom fin, a top fin, multiple first middle fins and multiple second middle fins, the bottom fin is separately connected to the first side plate, the baffle and the third side plate to associate with the bottom plate and the second side plate to constitute the bottom flow channel, the multiple first middle fins and the multiple second middle fins are interlacedly disposed at intervals from bottom to top, the multiple first middle fins are separately connected to the first side plate, the second side plate and the third side plate to associate with the bottom plate and the baffle to constitute the multiple middle flow channels, and the multiple second middle fins are separately connected to the first side plate, the baffle and the third side plate to associate with the bottom plate and the second side plate to constitute the multiple middle flow channels.

8. The pump-driven two-phase flow system preheated in integration of claim 7, wherein the multiple cooling fins further comprise multiple auxiliary fins located on the bottom flow channel and the top flow channel.

9. The pump-driven two-phase flow system preheated in integration of claim 1, wherein a tank of the liquid storage tank is configured into a thermally isolated tank, the condenser comprises a condenser body and multiple cooling fans, and the condenser body is connected between the evaporation cooling plate and the liquid storage tank.

10. The pump-driven two-phase flow system preheated in integration of claim 5, wherein the pump casing is formed with a set of symmetric rib sheets to divide the preheating chamber into an upper layer and a lower layer, the upper layer communicates with the evaporation cooling plate, a space is kept between a rear side of the rib sheet and the chamber, other sides of the rib sheet are connected to the chamber, and the upper layer communicates with the lower layer through the space.

11. The pump-driven two-phase flow system preheated in integration of claim 10, wherein front sides and rear sides of the cooling fins keep an interval with the chamber, the cooling fin extends from one end toward the other end, and an extended distal end is connected to the chamber.

12. The pump-driven two-phase flow system preheated in integration of claim 1, wherein the pump-driven two-phase flow system preheated in integration further comprises a temperature sensor disposed at an inlet of the evaporation cooling plate.

13. The pump-driven two-phase flow system preheated in integration of claim 2, wherein the pump-driven two-phase flow system preheated in integration further comprises a temperature sensor disposed at an inlet of the evaporation cooling plate.

14. The pump-driven two-phase flow system preheated in integration of claim 3, wherein the pump-driven two-phase flow system preheated in integration further comprises a temperature sensor disposed at an inlet of the evaporation cooling plate.

15. The pump-driven two-phase flow system preheated in integration of claim 4, wherein the pump-driven two-phase flow system preheated in integration further comprises a temperature sensor disposed at an inlet of the evaporation cooling plate.

16. The pump-driven two-phase flow system preheated in integration of claim 5, wherein the pump-driven two-phase flow system preheated in integration further comprises a temperature sensor disposed at an inlet of the evaporation cooling plate.

17. The pump-driven two-phase flow system preheated in integration of claim 6, wherein the pump-driven two-phase flow system preheated in integration further comprises a temperature sensor disposed at an inlet of the evaporation cooling plate.

18. The pump-driven two-phase flow system preheated in integration of claim 7, wherein the pump-driven two-phase flow system preheated in integration further comprises a temperature sensor disposed at an inlet of the evaporation cooling plate.

19. The pump-driven two-phase flow system preheated in integration of claim 8, wherein the pump-driven two-phase flow system preheated in integration further comprises a temperature sensor disposed at an inlet of the evaporation cooling plate.

20. The pump-driven two-phase flow system preheated in integration of claim 9, wherein the pump-driven two-phase flow system preheated in integration further comprises a temperature sensor disposed at an inlet of the evaporation cooling plate.

21. The pump-driven two-phase flow system preheated in integration of claim 10, wherein the pump-driven two-phase flow system preheated in integration further comprises a temperature sensor disposed at an inlet of the evaporation cooling plate.

22. The pump-driven two-phase flow system preheated in integration of claim 11, wherein the pump-driven two-phase flow system preheated in integration further comprises a temperature sensor disposed at an inlet of the evaporation cooling plate.

* * * * *